(12) United States Patent
Lin

(10) Patent No.: US 7,138,337 B2
(45) Date of Patent: Nov. 21, 2006

(54) METHODS OF FORMING TUNGSTEN CONTACTS BY CHEMICAL VAPOR DEPOSITION

(75) Inventor: Su-Horng Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 56 days.

(21) Appl. No.: 10/904,817

(22) Filed: Nov. 30, 2004

(65) Prior Publication Data

US 2006/0115985 A1   Jun. 1, 2006

(51) Int. Cl.
*H01L 21/44* (2006.01)

(52) U.S. Cl. .......................... 438/685; 438/648; 438/656

(58) Field of Classification Search .............. 438/625, 438/631, 642, 648, 656, 637, 629, 685, 675
See application file for complete search history.

(56) References Cited

U.S. PATENT DOCUMENTS

| | | | |
|---|---|---|---|
| 5,371,041 A | 12/1994 | Liou et al. | |
| 6,271,129 B1 | 8/2001 | Ghanayem et al. | |
| 6,472,309 B1 * | 10/2002 | Li | 438/683 |
| 6,489,239 B1 * | 12/2002 | Jang et al. | 438/685 |
| 6,593,233 B1 | 7/2003 | Miyazaki et al. | |
| 6,635,965 B1 | 10/2003 | Lee et al. | |
| 6,686,278 B1 | 2/2004 | Wang et al. | |
| 6,787,461 B1 | 9/2004 | Wang et al. | |
| 6,787,466 B1 * | 9/2004 | Herner | 438/648 |
| 6,939,804 B1 * | 9/2005 | Lai et al. | 438/685 |
| 2004/0224501 A1 * | 11/2004 | Lo et al. | 438/685 |
| 2005/0042829 A1 * | 2/2005 | Kim et al. | 438/268 |
| 2005/0208763 A1 * | 9/2005 | Byun | 438/685 |

* cited by examiner

*Primary Examiner*—Kevin M. Picardat
(74) *Attorney, Agent, or Firm*—Baker & McKenzie LLP

(57) ABSTRACT

Described are methods of manufacturing a semiconductor device with tungsten contacts between two conductive layers on different interconnect levels. A barrier adhesion layer is formed over interconnect openings followed by a tungsten nucleation film being deposited at a nucleation temperature and a tungsten bulk deposition film being deposited at a bulk deposition temperature, wherein the nucleation temperature is higher than the bulk deposition temperature such that the difference between the nucleation temperature and the bulk deposition temperature improves tungsten gap-fill capability.

20 Claims, 6 Drawing Sheets

METHODS OF FORMING TUNGSTEN CONTACTS BY CHEMICAL VAPOR DEPOSITION

FIELD OF ACTIVITY

This disclosure relates generally to semiconductor manufacturing techniques, and more particularly to methods of forming tungsten contacts by chemical vapor deposition.

BACKGROUND

As the demands for multi-functional integrated circuits increase, more and more levels of metal interconnects are required to satisfy such increase in device complexity. Tungsten has become the metal interconnect of choice because of its low contact resistance and its ability to be deposited onto the semiconductor substrate by a variety of methods, such as sputtering, physical vapor deposition, and chemical vapor deposition. Chemical vapor deposition is a process in which chemical reactions between gaseous molecules react within a chamber thereby resulting in the formation of thin metallic films, and has been particularly favored for the formation of tungsten contacts because of its excellent gap-filling property. Such gap-filling property, or the ability to provide complete step coverage of the feature size, becomes even more critical as semiconductor devices challenge the sub-micron regime with ever-shrinking feature sizes.

U.S. Pat. Nos. 6,635,965, 6,593,233, 6,271,129, and 5,371,041 disclose conventional techniques for forming tungsten contacts within the layers of semiconductor wafers by chemical vapor deposition. Unfortunately, such conventional techniques typically result in the formation of voids within the metal contacts, which can detrimentally affect the overall performance of the contacts. In many cases, these conventional techniques have been resulted in voids in upwards of about 25 nm to 30 nm, which can seriously affect overall device performance. Accordingly, what is needed is a technique for forming metal contacts within semiconductor layers that does not suffer from the deficiencies of conventional techniques.

SUMMARY

Disclosed are methods of manufacturing a semiconductor device with tungsten contacts by chemical vapor deposition. A barrier adhesion layer is formed over interconnect openings followed by a tungsten nucleation film being deposited at a nucleation temperature and a tungsten bulk deposition film being deposited at a bulk deposition temperature, wherein the nucleation temperature is higher than the bulk deposition temperature such that the difference between the nucleation temperature and the bulk deposition temperature improves tungsten gap-fill capability. The tungsten contact then undergoes a chemical mechanical polish and another conductive layer is subsequently formed over the leveled tungsten contacts.

In one specific embodiment of the disclosed technique, a method of manufacturing a semiconductor device with tungsten contacts includes providing a substrate, forming a dielectric layer over the substrate, and then forming interconnect openings within the dielectric layer. In addition, the method includes depositing a barrier adhesion layer over the dielectric layer and within the interconnect openings. Also in such embodiments, the method includes forming a tungsten nucleation film over the barrier adhesion layer and within the interconnect openings at a nucleation temperature. Then, this embodiment of the method provides for forming a tungsten bulk deposition film over the tungsten nucleation film at a bulk deposition temperature that is lower than the nucleation temperature to fill the interconnect openings to form the tungsten contacts.

DETAILED DESCRIPTION OF THE EMBODIMENTS

Initial reference is made to FIGS. 1A–1E, which show a series of schematic cross-sectional diagrams illustrating the results of progressive stages of forming tungsten contacts between two conductive layers by chemical vapor deposition. The formation of the tungsten contacts is done in accordance with the disclosed principles, which results in a more reliable overall semiconductor device, as discussed in more detail below.

Figure 1A:
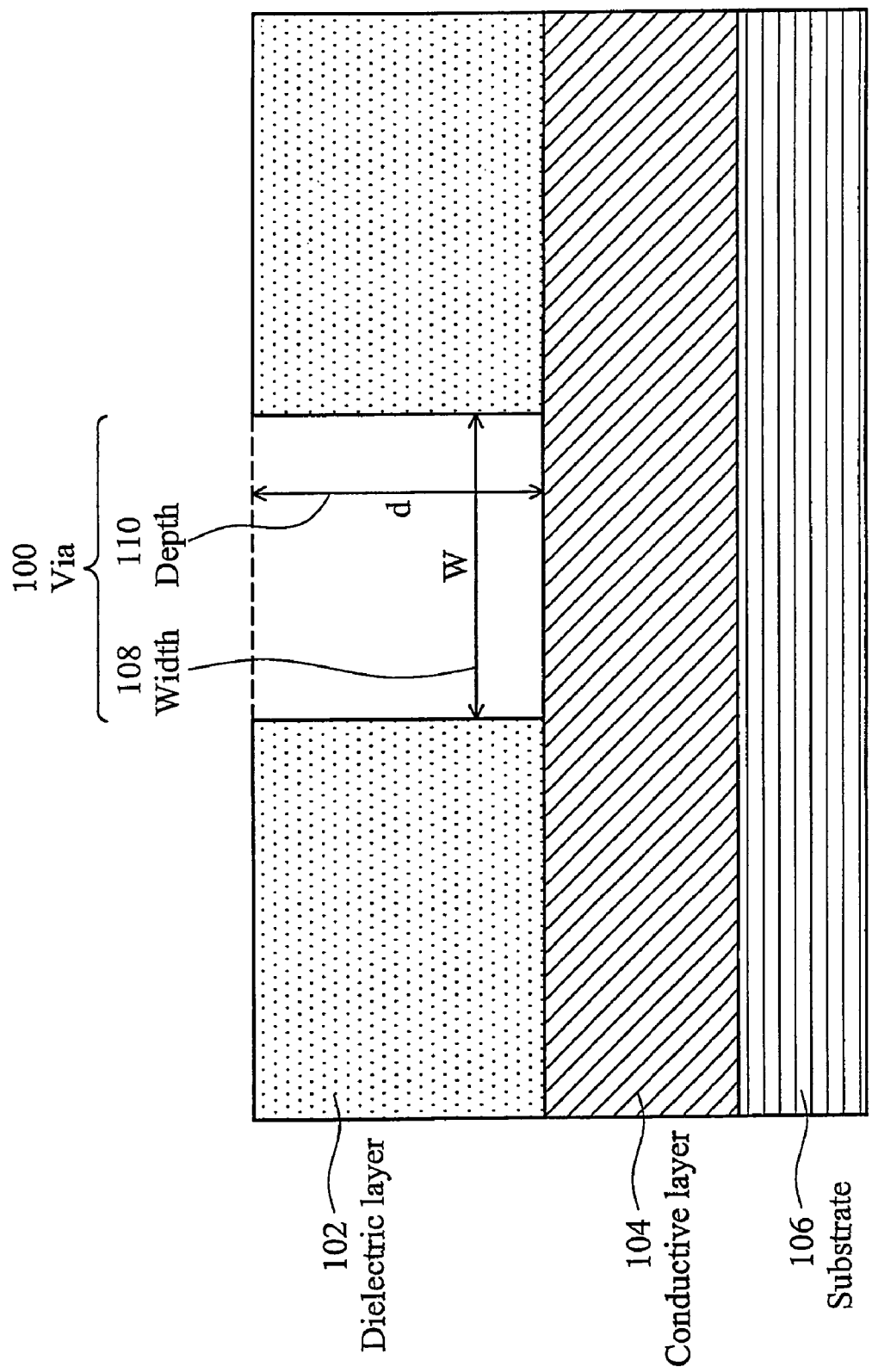
FIGS. 1A–1E are schematic cross-sectional diagrams illustrating the results of progressive stages of forming tungsten contacts between two conductive layers by chemical vapor deposition.

In FIG. 1A, an interconnect opening, such as a trench or a via 100, has been defined within a dielectric layer 102 formed over a conductive layer 104, and on top of the semiconductor substrate 106, using known methods and techniques. The dielectric layer 102 in this embodiment comprises silicon nitride or silicon oxide, while the conductive layer 104 may comprise various levels of the integrated circuit, such as interlevel metal dielectric, gate electrodes, interlevel dielectric, isolation regions, capacitors and other features or devices commonly found in semiconductor devices.

The via 100 may also be defined within the dielectric layer 102 when the dielectric layer 102 is formed directly on the semiconductor substrate 106 and without the conductive layer 104 in between them. Furthermore, the via 100 may also be defined within the semiconductor substrate 106 itself, although tungsten contacts are most often formed on some interconnect level above the semiconductor substrate 106. The via 100 has an aspect ratio defined as the ratio of the depth 110 of the via 100 relative to the width 108 of the via 100. For example, if the via 100 has a depth 110 of one micron and a width 108 of 0.1 micron, then the via 100 has an aspect ratio of 10:1 (1 micron deep: 0.1 micron wide).

Figure 1B:
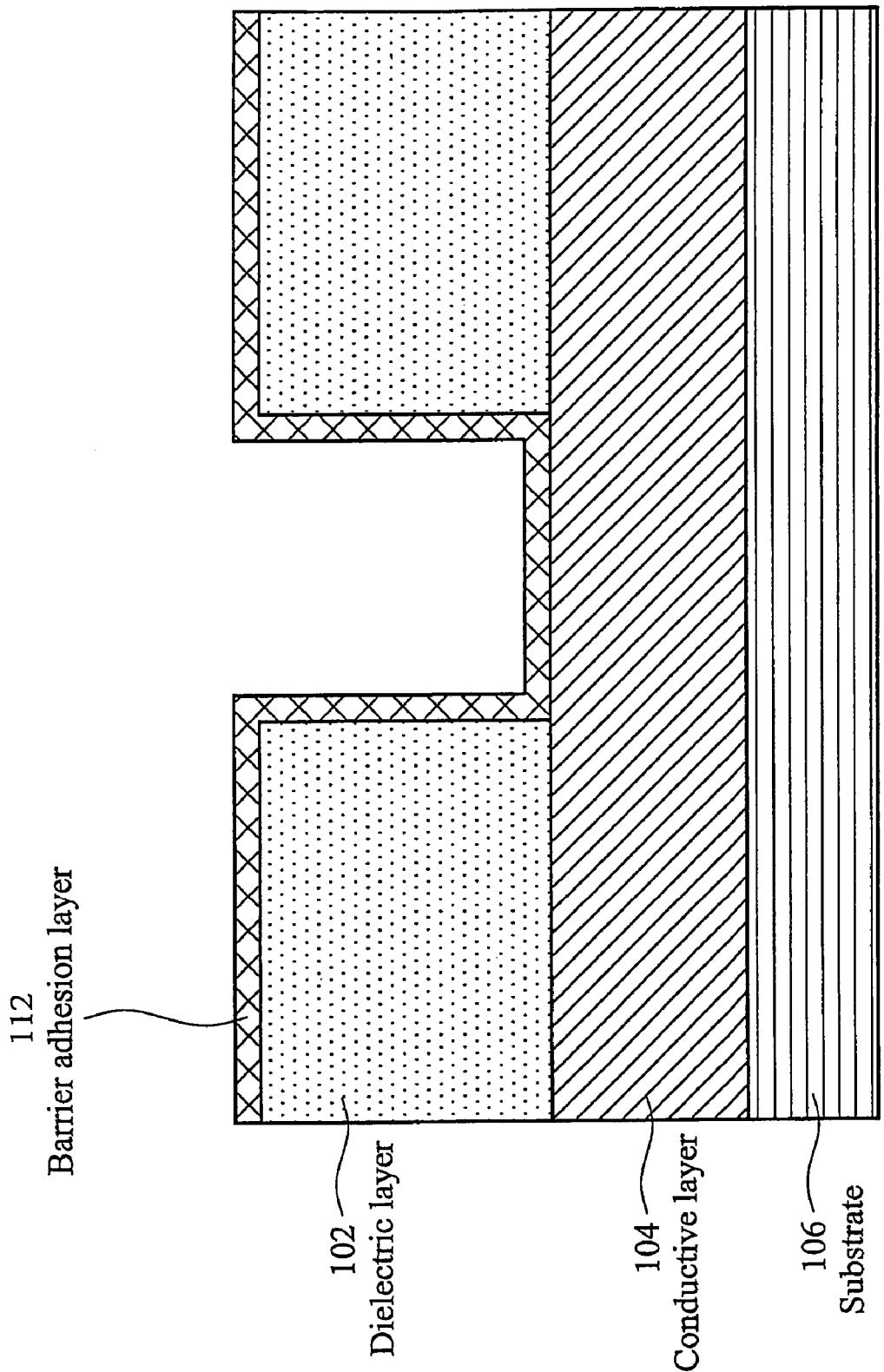

A barrier adhesion layer 112 is subsequently formed over the structure in FIG. 1A, as illustrated in FIG. 1B. The barrier adhesion layer 112 may be formed using blanket-depositing techniques, however, any appropriate technique is envisioned. The barrier adhesion layer 112 works as a diffusion barrier by preventing later-deposited tungsten metal from spiking or diffusing into the conductive layer 104 or the semiconductor substrate 106. This barrier adhesion layer 112 typically comprises titanium nitride, tantalum nitride, or nitrided titanium-tungsten film deposited by sputtering or chemical vapor deposition techniques. Of course, other compositions for the barrier adhesion layer 112, as well as the methods for forming the layer, are also possible. The barrier adhesion layer 112 also helps to improve the adhesion of the tungsten contacts formed as set forth below.

Figure 1C:
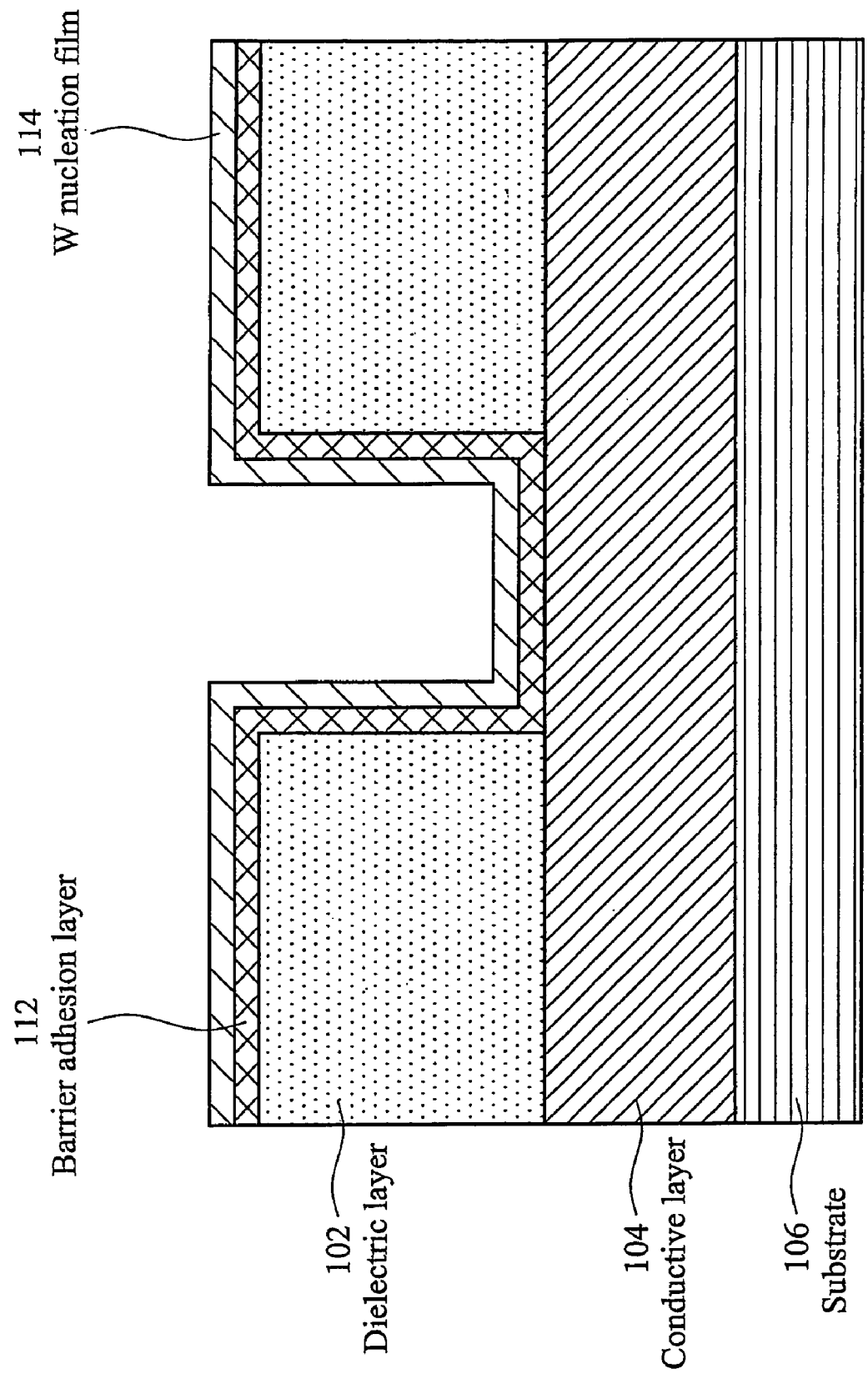
Figure 1D:
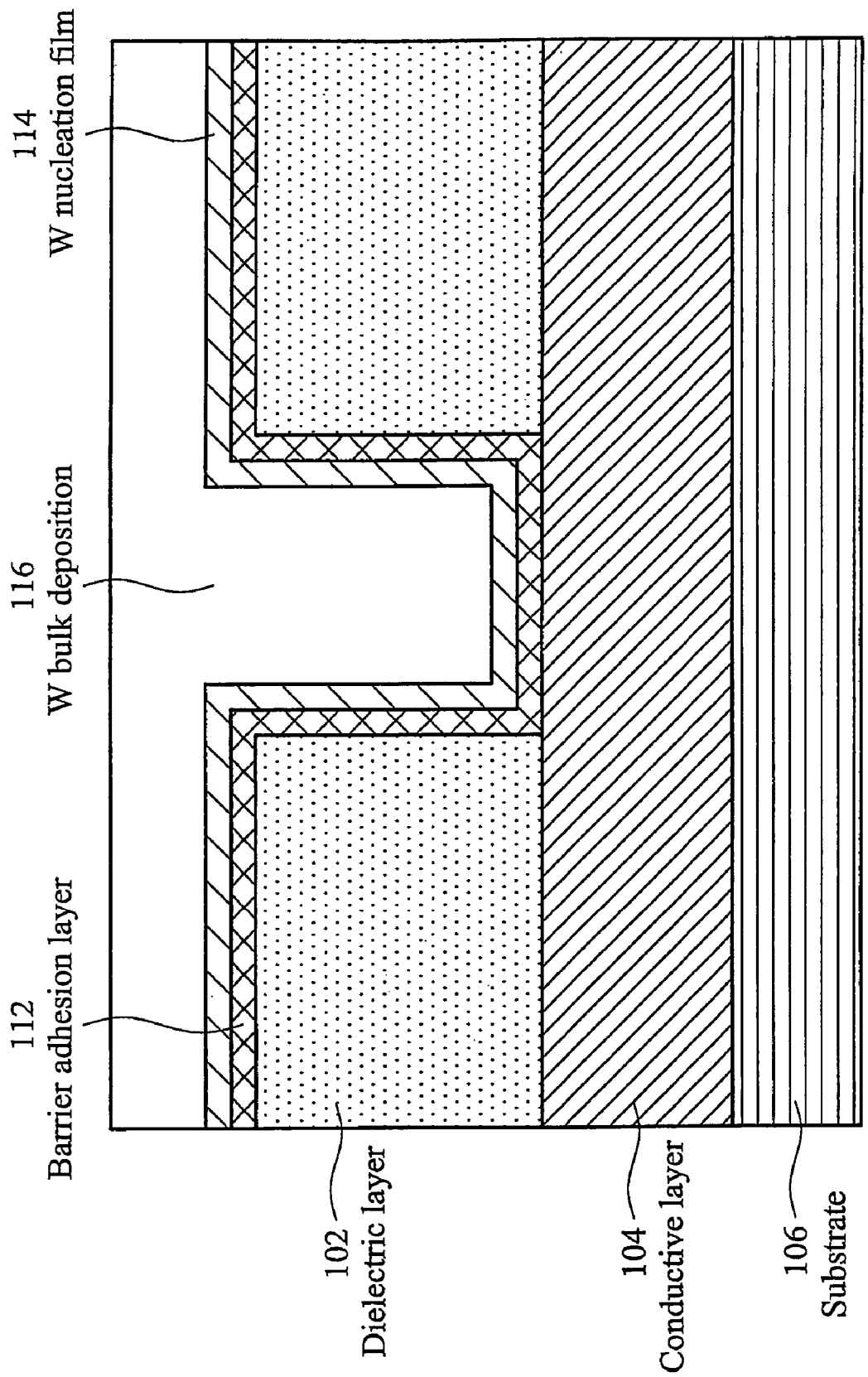

The structure illustrated in FIG. 1B subsequently undergoes a chemical vapor deposition process, resulting in the formation of tungsten contacts or other tungsten metallization, as is illustrated in FIGS. 1C–1D. In general, chemical vapor deposition of tungsten comprises two principal steps, an initial nucleation step, followed by a bulk deposition step. In the initial nucleation step illustrated in FIG. 1C, tungsten hexafluoride ($WF_6$) is chemically reduced by silane gas ($SiH_4$) at a nucleation temperature according to equation (1) to deposit a layer of tungsten nucleation film 114.

$$2WF_6 + 3SiH_4 \rightarrow 2W + 3SiF_4 + 6H_2 \quad (1)$$

The nucleation temperature is the temperature at which the nucleation rate or the rate of growing the tungsten nucleation layer 114 will be the highest. In an advantageous embodiment, this nucleation temperature is between about 415° C. and about 460° C. In preferred embodiments, the nucleation temperature is more precisely between about 430° C. and about 450° C. In addition, in preferred embodiments, the resulting tungsten nucleation film 114 has been formed with a film thickness of between about 100 Å and about 500 Å. However, other thicknesses may also be employed, as needed.

In the latter bulk deposition step illustrated in FIG. 1D, the tungsten hexafluoride ($WF_6$) is further chemically reduced by the introduction of hydrogen gas ($H_2$) at a bulk deposition temperature according to equation (2) to give a layer of tungsten bulk deposition film 116.

$$WF_6 + 3H_2 \rightarrow W + 6HF \quad (2)$$

The bulk deposition temperature is the temperature at which the tungsten bulk deposition film 116 will grow and complete the gap filling process of the tungsten contacts. In advantageous embodiments, the bulk deposition temperature according to the disclosed principles is selected to be between about 350° C. and about 410° C. In preferred embodiments, the bulk deposition temperature is more precisely between about 370° C. and about 400° C. In addition, in preferred embodiments, the resulting tungsten bulk deposition film 116 has a thickness of between about 1,000 Å and about 5,000 Å, although again other thicknesses are possible, as different applications may require.

Figure 1E:
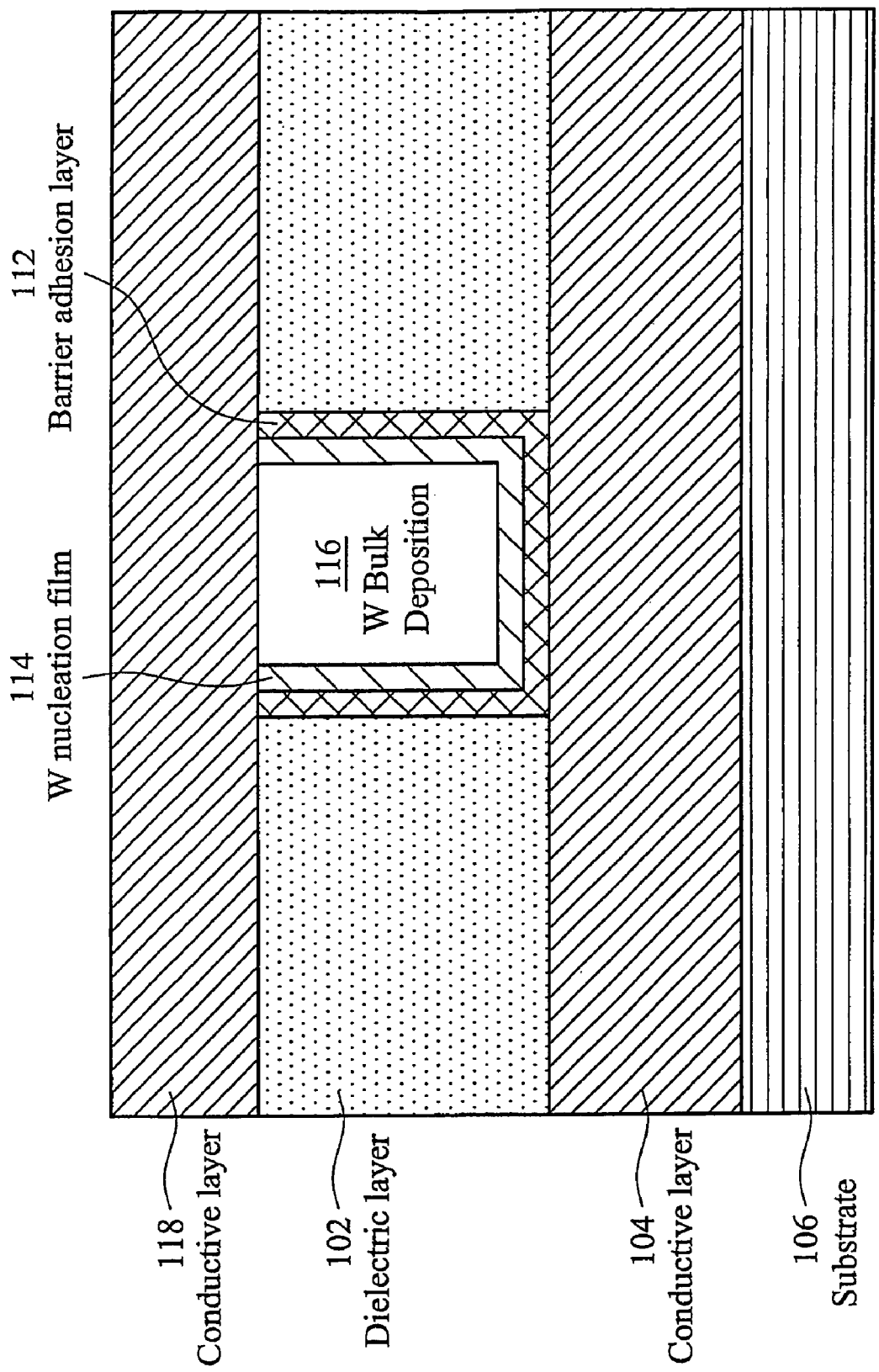

After undergoing the disclosed nucleation step and bulk deposition step, in accordance with the disclosed techniques, the wafer is then subjected to a chemical mechanical polish to planarize or smooth any protrusions. After the chemical mechanical planarization has been completed, the tungsten plugs have typically been reduced to the same height at the dielectric layer 102 in which they have been formed, as seen in FIG. 1E. After such planarization of the tungsten contacts 116, another conductive layer 118 may then be deposited over the polished tungsten contacts 116, also illustrated in FIG. 1E. The conductive layer 118 may not be necessary if the tungsten contact is to serve as the final electrical metal interconnect in the semiconductor device.

Because of the difference between the nucleation temperature and the bulk deposition temperature provided by the disclosed technique during the tungsten chemical vapor deposition process, the resulting tungsten contacts are formed with small grain sizes and no significant voids in the metal contact. Grain size is defined as the average diameter of the individual metallic particles forming the contact, and the smaller the grain, the lower the probability of voids forming within the metal contact. In general, tungsten contact formed utilizing the disclosed techniques exhibited smaller than typical grain sizes, and therefore substantially no voids in the finished tungsten contacts. Furthermore, the tungsten contacts had a typical aspect ratio of about 3.5:1, evidenced by a depth of about 0.45 microns and a width of about 0.13 microns.

Figure 2:
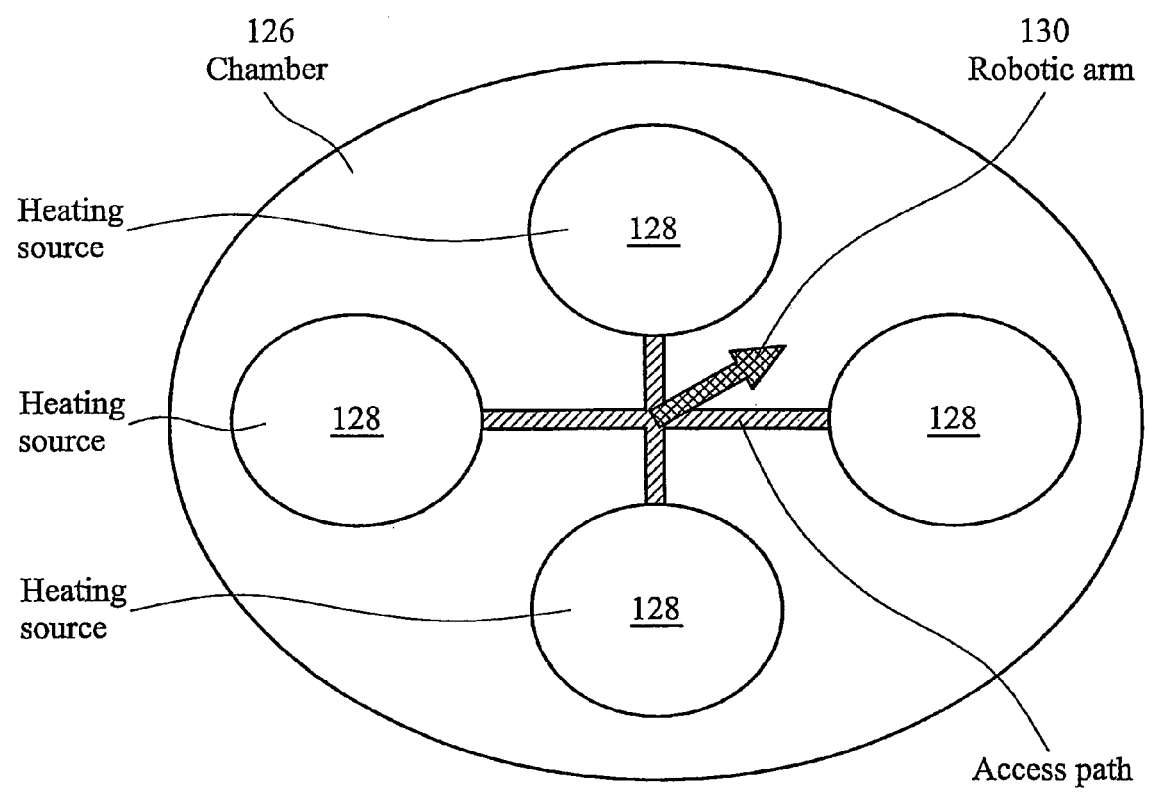
FIG. 2 illustrates a chemical vapor deposition chamber with multiple heating sources for use in the disclosed techniques.

Processing at the nucleation temperature and at the bulk deposition temperature in accordance with the disclosed principles may be accomplished in a conventional chemical vapor deposition chamber 126, but with multiple heating sources 128, such the one illustrated in FIG. 2. The multiple heating sources 128 allow for flexible manipulations of the processing temperatures, and more importantly it allows the manufacturer to precisely select the higher nucleation temperature, and the lower bulk deposition temperature, as taught herein. By employing distinct heating source for the nucleation and bulk deposition temperatures, the processing time for a group of wafers may be significantly decreased by employing the multiple heating sources. For example, two of the heating sources 128 may be maintained at the optimal nucleation temperature disclosed herein, while the other two heating sources 128 may be maintained at the optimal bulk deposition temperature disclosed herein. Once a wafer has finished undergoing deposition of the tungsten nucleation film 114 within a first heating source 128, it can then be transported by a robotic arm 130 that traverses on an access path 132 to another heating source 128 for the formation of the tungsten bulk deposition film 116. This expedites the processing of the wafers because the heating sources 128 are located within one chamber 126 that is under constant pressure, and because the temperature of a single heating source does not have to be altered during the manufacturing process. In addition to the four heating sources 128 illustrated within the chamber 126, this process can also be accomplished in a chamber 126 with a single heating source 128 by changing the temperature during manufacturing, although with reduced throughput, or it can also be accomplished in a chamber 126 with two, three, five, or other number of heating sources 128.

Perhaps more importantly, the elevated nucleation temperature relative to the lowered bulk deposition temperature improves surface interfaces between layers formed during the manufacturing of the contacts, particularly between the barrier adhesion layer 112 and the tungsten nucleation film 114. In addition, the relatively elevated nucleation temperature also translates into smaller nucleation grain sizes and smoother grains, which improves the contact between the nucleation film 114 and the bulk deposition film 116. Consequently, by lowering the bulk deposition temperature below the increased nucleation temperature, as disclosed herein, the bulk deposition film 116 is better at adsorbing onto the grain surface of the nucleation film 114 and promoting the growth of newer smaller grains that are essentially free of voids. These smaller grains of the metal particles forming the contact are smaller than those formed using conventional CVD techniques for metal contact formation, which means an increased gap-filling ability using the disclosed technique. Furthermore, smaller grains and smoother growth surface interfaces also translate into lower contact resistance and lower sheet resistance (at the same stress), thus resulting in increased transistor speed and performance over devices manufactured using conventional contact formation techniques.

Although the above description sets forth advantages relative to certain prior art implementations, these examples and their performance specifications should not be construed in any way as limitations on the invention or inventions disclosed. The scope of coverage for any patent that issues shall be defined by the claims that any such patent contains. It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes that come within the meaning and ranges of equivalents thereof are intended to be embraced therein.

Additionally, the section headings herein are provided for consistency with the suggestions under 37 C.F.R. § 1.77 or otherwise to provide organizational cues. These headings shall not limit or characterize the invention(s) set out in any claims that may issue from this disclosure. Specifically and by way of example, although the headings refer to a "Technical Field," the claims should not be limited by the language chosen under this heading to describe the so-called technical field. Further, a description of a technology in the "Background" is not to be construed as an admission that technology is prior art to any invention(s) in this disclosure. Neither is the "Summary of the Invention" to be considered as a characterization of the invention(s) set forth in the claims found herein. Furthermore, any reference in this disclosure to "invention" in the singular should not be used to argue that there is only a single point of novelty claimed in this disclosure. Multiple inventions may be set forth according to the limitations of the multiple claims associated with this disclosure, and the claims accordingly define the invention(s), and their equivalents, that are protected thereby. In all instances, the scope of the claims shall be considered on their own merits in light of the specification, but should not be constrained by the headings set forth herein.

What is claimed is:

1. A method of manufacturing a semiconductor device with tungsten contacts, the method comprising:
   providing a substrate;
   forming a dielectric layer over the substrate;
   forming interconnect openings within the dielectric layer;
   depositing a barrier adhesion layer over the dielectric layer and within the interconnect openings;
   forming a tungsten nucleation film over the barrier adhesion layer and within the interconnect openings by simultaneously introducing a tungsten compound and reducing compound at a nucleation temperature; and
   forming a tungsten bulk deposition film over the tungsten nucleation film at a bulk deposition temperature that is lower than the nucleation temperature to fill the interconnect openings and thereby form the tungsten contacts.

2. A method according to claim 1, wherein the nucleation temperature is between about 415° C. and about 460° C.

3. A method according to claim 2, wherein the nucleation temperature is between about 430° C. and about 450° C.

4. A method according to claim 3, wherein the bulk deposition temperature is between about 370° C. and about 410° C.

5. A method according to claim 4, wherein the bulk deposition temperature is between about 370° C. and about 400° C.

6. A method according to claim 1, further comprising forming a tungsten nucleation film to a thickness of between about 100 Å and about 500 Å.

7. A method according to claim 1, further comprising forming a tungsten bulk deposition film to a thickness of between about 1,000 Å and about 5,000 Å.

8. A method according to claim 1, further comprising forming a first conductive layer over the substrate, and forming the dielectric layer over the first conductive layer, wherein the interconnect openings are formed through the dielectric layer to the first conductive layer.

9. A method according to claim 1, further comprising planarizing the tungsten contacts to substantially the same level as the dielectric layer.

10. A method according to claim 9, forming a second conductive layer over the dielectric layer and in contact with the tungsten contacts.

11. A method according to claim 1, wherein the temperature for the nucleation film is provided by a first heating source and the temperature for the bulk deposition film is provided by a second heating source.

12. A method of manufacturing a semiconductor device with tungsten contacts, the method comprising:
    providing a substrate;
    forming a dielectric layer over the substrate;
    forming interconnect openings within the dielectric layer;
    depositing a barrier adhesion layer over the dielectric layer and within the interconnect openings;
    forming a tungsten nucleation film over the barrier adhesion layer and within the interconnect openings at a nucleation temperature between about 415° C. and about 460° C.; and
    forming a tungsten bulk deposition film over the tungsten nucleation film at a bulk deposition temperature lower than the nucleation temperature and between about 350° C. and about 410° C. to fill the interconnect openings and thereby form the tungsten contacts.

13. A method according to claim 12, wherein the nucleation temperature is between about 430° C. and about 450° C.

14. A method according to claim 12, wherein the bulk deposition temperature is between about 370° C. and about 400° C.

15. A method according to claim 12, further comprising forming a tungsten nucleation film to a thickness of between about 100 Å and about 500 Å.

16. A method according to claim 12, further comprising forming a tungsten bulk deposition film to a thickness of between about 1,000 Å and about 5,000 Å.

17. A method according to claim 12, further comprising forming a first conductive layer over the substrate, and forming the dielectric layer over the first conductive layer, wherein the interconnect openings are formed through the dielectric layer to the first conductive layer.

18. A method according to claim 12, further comprising planarizing the tungsten contacts to substantially the same level as the dielectric layer.

19. A method according to claim 18, forming a second conductive layer over the dielectric layer and in contact with the tungsten contacts.

20. A method according to claim 12, wherein the temperature for the nucleation film is provided by a first heating source and the temperature for the bulk deposition film is provided by a second heating source.

* * * * *